United States Patent
Shrivastava et al.

(10) Patent No.: US 8,643,090 B2
(45) Date of Patent: Feb. 4, 2014

(54) SEMICONDUCTOR DEVICES AND METHODS FOR MANUFACTURING A SEMICONDUCTOR DEVICE

(75) Inventors: Mayank Shrivastava, Mumbai (IN);
Harald Gossner, Riemerling (DE);
Ramgopal Rao, Mumbai (IN); Maryam Shojaei Baghini, Mumbai (IN)

(73) Assignee: Infineon Technologies AG, Neubiberg (DE)

( * ) Notice: Subject to any disclaimer, the term of this patent is extended or adjusted under 35 U.S.C. 154(b) by 493 days.

(21) Appl. No.: 12/408,839

(22) Filed: Mar. 23, 2009

(65) Prior Publication Data
US 2010/0237412 A1    Sep. 23, 2010

(51) Int. Cl.
*H01L 29/66* (2006.01)

(52) U.S. Cl.
USPC ........... 257/330; 257/334; 257/335; 257/337; 257/E21.418; 257/E21.419; 257/E21.428; 257/E29.2; 257/E29.201; 257/E29.26; 257/E29.257; 438/270; 438/286; 438/330

(58) Field of Classification Search
USPC .............. 257/305, 328–330, 334, 335, 337, 257/E21.384, E21.418, E21.419, E21.428, 257/E29.2, E29.201, E29.26, E29.257, 257/E29.321; 438/270, 286, 330, FOR. 180, 438/FOR. 192, FOR. 176
See application file for complete search history.

(56) References Cited

U.S. PATENT DOCUMENTS

| | | | |
|---|---|---|---|
| 5,304,827 A | 4/1994 | Malhi et al. | |
| 5,306,656 A | 4/1994 | Williams et al. | |
| 5,313,082 A | 5/1994 | Eklund | |
| 5,406,110 A | 4/1995 | Kwon et al. | |
| 5,430,316 A | 7/1995 | Contiero et al. | |
| 5,501,994 A | 3/1996 | Mei | |
| 5,650,658 A | 7/1997 | Beasom | |
| 5,736,766 A | 4/1998 | Efland et al. | |
| 5,747,850 A | 5/1998 | Mei | |
| 5,777,371 A | 7/1998 | Kawaguchi et al. | |
| 6,124,611 A | 9/2000 | Mori | |
| 6,660,603 B2 | 12/2003 | Mitros | |
| 6,900,101 B2 | 5/2005 | Lin | |
| 6,960,807 B2 | 11/2005 | Pendharkar | |
| 7,005,354 B2 | 2/2006 | Pan et al. | |
| 7,176,091 B2 | 2/2007 | Pendharkar | |

(Continued)

FOREIGN PATENT DOCUMENTS

WO    2007124413 A2    11/2007

OTHER PUBLICATIONS

J. A. Apels et al., "High Voltage Thin Layer Devices (RESURF Devices)", IEEE Electron Devices Meeting (IEDM) Tech. Digest. pp. 238-241, 1979.

(Continued)

*Primary Examiner* — Meiya Li

(57) ABSTRACT

In various embodiments, a semiconductor device is provided. The semiconductor device may include a first source/drain region, a second source/drain region, an active region electrically coupled between the first source/drain region and the second source/drain region, a trench disposed between the second source/drain region and at least a portion of the active region, a first isolation layer disposed over the bottom and the sidewalls of the trench, electrically conductive material disposed over the isolation layer in the trench, a second isolation layer disposed over the active region, and a gate region disposed over the second isolation layer. The electrically conductive material may be coupled to an electrical contact.

16 Claims, 14 Drawing Sheets

(56) References Cited

U.S. PATENT DOCUMENTS

| | | |
|---|---|---|
| 7,473,976 B2 | 1/2009 | Kocon |
| 2006/0113627 A1* | 6/2006 | Chen et al. .................... 257/500 |
| 2009/0140343 A1* | 6/2009 | Feilchenfeld et al. ........ 257/367 |

OTHER PUBLICATIONS

M. Imam et al., "Efficacy of Charge Sharing in Reshaping the Surface Electric Field in High-Voltage Lateral RESURF Devices", IEEE Trans. Electron Devices, vol. 51, pp. 141-148, 2004.

A. Moscatelli et al., "LDMOS implementation in a 0.35 μm BCD technology (BCD6)", Proc. ISPSD 2000, Toulouse, France, 2000, pp. 323-326.

T. Efland et al., "Optimized Complementary 40V Power LDMOS-FETs Use Existing Fabrication Steps in Submicron CMOS Technology", IEEE Electron Devices Meeting (IEDM) Tech. Digest, pp. 399-402, Dec. 1994.

E. Takeda et al., "An Empirical Model for Device Degradation Due to Hot-Carrier Injection", IEEE Electron Device Letters, vol. No. 4, No. 1, pp. 111-113, Jan. 1983.

P. Moens et al., "A novel hot-hole injection degradation model for lateral nDMOS transistors", IEEE Electron Devices Meeting (IEDM) Tech. Digest, pp. 877-880, 2001.

Dhanoop Varghese et al., "Off-State Degradation in Drain-Extended NMOS Transistors: Interface Damage and Correlation to Dielectric Breakdown", IEEE Trans. Electron Devices, vol. 54, pp. 2669-2678, 2007.

P. Hower et al., "Integrating power devices into silicon roadmaps", IEE Proceedings on Circuits, Devices and Systems, vol. 153, Issue 1, pp. 73-78, Feb. 2006.

* cited by examiner

SEMICONDUCTOR DEVICES AND METHODS FOR MANUFACTURING A SEMICONDUCTOR DEVICE

TECHNICAL FIELD

Embodiments relate generally to semiconductor devices and to methods for manufacturing a semiconductor device.

BACKGROUND

A so-called Lightly-Doped Drain Metal Oxide Semiconductor (LDDMOS) (RESURF) device is currently in use for Input/Output (I/O) or high voltage applications. At scaled technology nodes, high drain resistance because of the presence of an LDD region (which is used to increase the breakdown voltage), degrades its mixed signal performance and also it may have high hot carrier degradation. To achieve higher breakdown voltage with improved mixed signal performance, a Drain extended MOS device may be used (DeMOS), but this device usually shows very high hot carrier degradation and high electrical field in the gate oxide. To reduce the electrical field in the gate oxide, a shallow trench isolation (STI) may conventionally be realized underneath the gate-to-drain-overlap using a standard STI process. This new STI DeMOS device, however, usually has an even worse mixed signal performance as compared to the previously mentioned devices.

BRIEF DESCRIPTION OF THE DRAWINGS

In the drawings, like reference characters generally refer to the same parts throughout the different views. The drawings are not necessarily to scale, emphasis instead generally being placed upon illustrating the principles of various embodiments. In the following description, various embodiments are described with reference to the following drawings, in which.

DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Various embodiments provide a semiconductor device, e.g. a drain extended Metal Oxide Semiconductor (MOS) device with sufficient dielectric reliability and hot carrier reliability and with only little or even without degraded mixed signal performance at high voltage Input/Output (I/O) interfaces in scaled Complementary Metal Oxide Semiconductor (CMOS) technologies. The extended drain region may be provided to reduce the voltage at the thin gate oxide.

As will be described in more detail below, in various embodiments, a drain extended metal oxide semiconductor (DeMOS) device and a dual gate process to manufacture the same is provided, which may improve the turn-on property without affecting gate dielectric reliability and hot charge carrier reliability.

Figure 1:
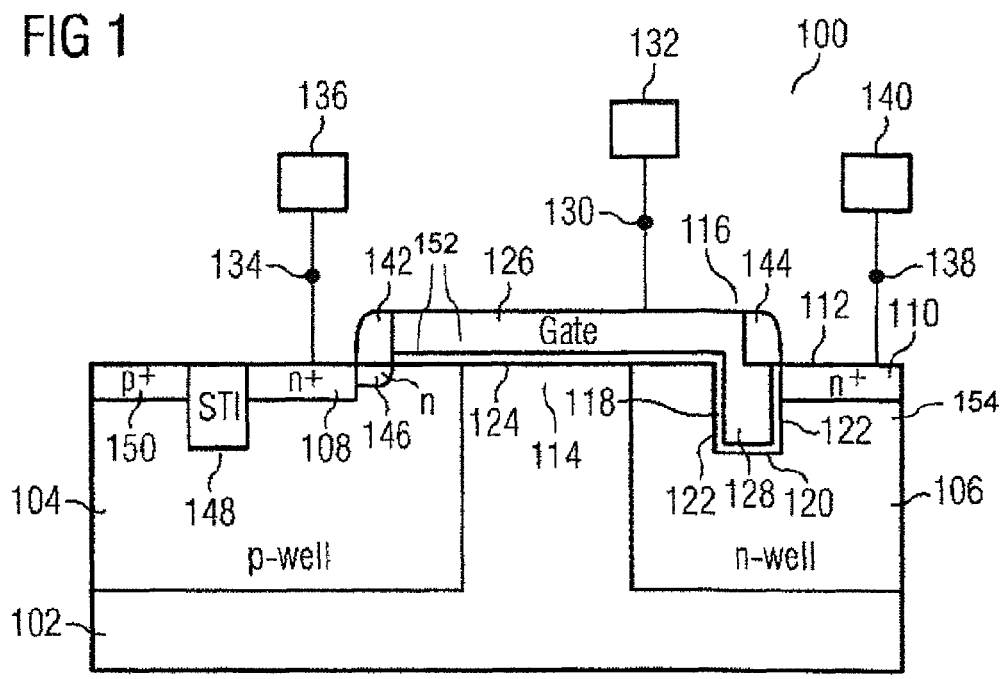
FIG. 1 shows a cross sectional view of a semiconductor device in accordance with an embodiment.

FIG. 1 shows a cross sectional view of a semiconductor device 100, e.g. implemented as a DeMOS semiconductor device 100, in accordance with an embodiment.

As shown in FIG. 1, the semiconductor device 100 may include a substrate 102, e.g. a p-doped substrate, e.g. a silicon substrate, e.g. a p-doped silicon substrate (e.g. having a doping concentration of p-doping atoms (such as e.g. Boron (B) atoms) in the range from about $10^{14}$ cm$^{-3}$ to about $10^{17}$ cm$^{-3}$, e.g. in the range from about $10^{15}$ cm$^{-3}$ to about $10^{16}$ cm$^{-3}$) in the case of an n-channel field effect semiconductor device 100. In the case of a p-channel field effect semiconductor device 100, an n-doped well region (not shown) may be provided in which the p-channel field effect semiconductor device 100 might be located. The n-doped well region may be doped with n-doping atoms (such as e.g. Arsenic (As) or Phosphorous (P)) in the range from about $10^{15}$ cm$^{-3}$ to about $10^{19}$ cm$^{-3}$, e.g. in the range from about $10^{17}$ cm$^{-3}$ to about $10^{18}$ cm$^{-3}$).

Although the elements described below with reference to FIG. 1 refer to an n-channel semiconductor device, the respective conductivity type of the doped regions may simply be inverted to provide a p-channel semiconductor device.

The semiconductor device 100 may further include a first well region 104, e.g. being p-doped (e.g. having a well doping concentration of p-doping atoms (such as e.g. Boron (B)

atoms) in the range from about $10^{16}$ cm$^{-3}$ to about $10^{19}$ cm$^{-3}$, e.g. in the range from about $5*10^{16}$ cm$^{-3}$ to about $5*10^{18}$ cm$^{-3}$, e.g. about $10^{17}$ cm$^{-3}$.

Furthermore, the semiconductor device 100 may further include a second well region 106, e.g. being n-doped (e.g. having a well doping concentration of n-doping atoms (such as e.g. Arsenic (As) or Phosphorous (P)) in the range from about $10^{16}$ cm$^{-3}$ to about $10^{19}$ cm$^{-3}$, e.g. in the range from about $5*10^{16}$ cm$^{-3}$ to about $5*10^{18}$ cm$^{-3}$, e.g. about $10^{17}$ cm$^{-3}$. The second well region 106 may be laterally disposed from the first well region 104. In an alternative embodiment, the first well region 104 may laterally extend below the gate stack (which will be described in more detail below) to the second well region 106 such that it is arranged immediately adjacent to the second well region 106.

In various embodiments, a first source/drain region 108 (e.g. a source region 108) may be provided in the first well region 104, wherein the first source/drain region 108 may be highly n-doped (n$^+$ doped) having a doping concentration in the range from about $10^{19}$ cm$^{-3}$ to about $10^{21}$ cm$^{-3}$, e.g. with a doping concentration of doping atoms in the range from about $5*10^{19}$ cm$^{-3}$ to about $5*10^{20}$ cm$^{-3}$. In general, the first source/drain region 108 may be doped with doping atoms of a first conductivity type, and the first well region 104 may be doped with doping atoms of a second conductivity type, wherein the second conductivity type is different from the first conductivity type.

Furthermore, in various embodiments, a second source/drain region 110 (e.g. a drain region 110) may be provided in the second well region 106, wherein the second source/drain region 110 may be highly n-doped (n$^+$ doped) having a doping concentration in the range from about $10^{19}$ cm$^{-3}$ to about $10^{21}$ cm$^{-3}$, e.g. with a doping concentration of doping atoms in the range from about $5*10^{19}$ cm$^{-3}$ to about $5*10^{20}$ cm$^{-3}$. In general, the second source/drain region 110 may be doped with doping atoms of the first conductivity type, and the second well region 106 may be doped with doping atoms of the first conductivity type as well.

In various embodiments, the first source/drain region 108 as well as the second source/drain region 110 may extend into the substrate 102 from the upper main processing surface 112 of the substrate 102 by a depth in the range from about 50 nm to about 200 nm, wherein the depth of the first source/drain region 108 and the depth of the second source/drain region 110 may be similar or different from each other.

An active region 114 (which may also be referred to as a body region 102) may also be provided electrically coupled between the first source/drain region 108 and the second source/drain region 110. The active region 114 may be understood as being a region which may be rendered electrically conductive (in other words form a conductive channel) in response to an appropriate voltage application to a gate region (which will be described in more detail below) and to the first source/drain region 108 and the second source/drain region 110. In an embodiment, the active region 114 laterally extends from the first source/drain region 108 to the second source/drain region 110 and may include a portion of the first well region 104 and a portion of the second well region 106.

In various embodiments, a trench 116 may be disposed between the second source/drain region 110 and at least a portion of the active region 114. In various embodiments, the trench 116 may extend into the substrate 102 from the upper main processing surface 112 of the substrate 102 by a depth in the range from about 300 nm to about 400 nm. In various embodiments, the trench 116 may have a width in the range from about 200 nm to about 1000 nm. Thus, illustratively, in various embodiments, the trench 116 may be understood as a shallow trench isolation structure partially filled with electrically conductive material.

In various embodiments, a first isolation layer 118 may be disposed over the bottom 120 and the sidewalls 122 of the trench 116. The first isolation layer 118 may include or consist of a dielectric material such as e.g. an oxide (e.g. silicon oxide), a nitride (e.g. silicon nitride) or an oxynitride (ON). In alternative embodiments, the first isolation layer 118 may include or consist of high k dielectric material (i.e. e.g. a material having a dielectric constant of greater than the dielectric constant of silicon oxide (which has a dielectric constant of 3.9)). In various implementations, the first isolation layer 118 may include or consist of may include or consist of aluminum oxide ($Al_2O_3$), yttrium oxide ($Y_2O_3$), hafnium oxide ($HfO_2$), lanthanum oxide ($LaO_2$), zirconium oxide ($ZrO_2$), amorphous silicon (a-Si), tantalum oxide ($Ta_2O_5$), titanium oxide ($TiO_2$), and/or an aluminate. An example for an aluminate is an alloy of the components aluminum, zirconium and oxygen (AlZrO). In an implementation, the first isolation layer 118 may include or consist of a dielectric layer stack including three dielectric layers being formed above one another, e.g. a first oxide layer (e.g. silicon oxide), a nitride layer as charge trapping layer (e.g. silicon nitride) on the first oxide layer, and a second oxide layer (e.g. silicon oxide or aluminum oxide) on the nitride layer. This type of dielectric layer stack is also referred to as ONO layer stack. In an alternative implementation, the first isolation layer 118 may include or consist of two, four or even more dielectric layers being formed above one another. In some embodiments, the first isolation layer 118 may cover the entire bottom 120 and the entire sidewalls 122 of the trench 116.

In various embodiments, a second isolation layer 124 (e.g. a gate dielectric layer 124) may be disposed over the active region 114. The second isolation layer 124 may include or consist of a dielectric material such as e.g. an oxide (e.g. silicon oxide), a nitride (e.g. silicon nitride) or an oxynitride (ON). In alternative embodiments, the second isolation layer 124 may include or consist of high k dielectric material (i.e. e.g. a material having a dielectric constant of greater than the dielectric constant of silicon oxide (which has a dielectric constant of 3.9)). In various implementations, the second isolation layer 124 may include or consist of may include or consist of aluminum oxide ($Al_2O_3$), yttrium oxide ($Y_2O_3$), hafnium oxide ($HfO_2$), lanthanum oxide ($LaO_2$), zirconium oxide ($ZrO_2$), amorphous silicon (a-Si), tantalum oxide ($Ta_2O_5$), titanium oxide ($TiO_2$), and/or an aluminate. An example for an aluminate is an alloy of the components aluminum, zirconium and oxygen (AlZrO). In an implementation, the second isolation layer 124 may include or consist of a dielectric layer stack including three dielectric layers being formed above one another, e.g. a first oxide layer (e.g. silicon oxide), a nitride layer as charge trapping layer (e.g. silicon nitride) on the first oxide layer, and a second oxide layer (e.g. silicon oxide or aluminum oxide) on the nitride layer. This type of dielectric layer stack is also referred to as ONO layer stack. In an alternative implementation, the second isolation layer 124 may include or consist of two, four or even more dielectric layers being formed above one another. In some embodiments, the second isolation layer 124 may have a physical layer thickness in the range from about 1.5 nm to about 5 nm, e.g. a physical layer thickness in the range from about 2 nm to about 3 nm and/or an equivalent oxide thickness (EOT) in the range from about 1 nm to about 2 nm.

In some embodiments, the first isolation layer 118 and the second isolation layer 124 may be made of the same material and may optionally be formed as one common layer or layer structure.

Furthermore, in various embodiments, a gate region 126 may be disposed over the second isolation layer 124. In some embodiments, the gate region 126 may include or consist of electrically conductive material such as e.g. polysilicon (doped or undoped) or a metal such as tungsten or a silicide (e.g. WSi).

Figure 10:
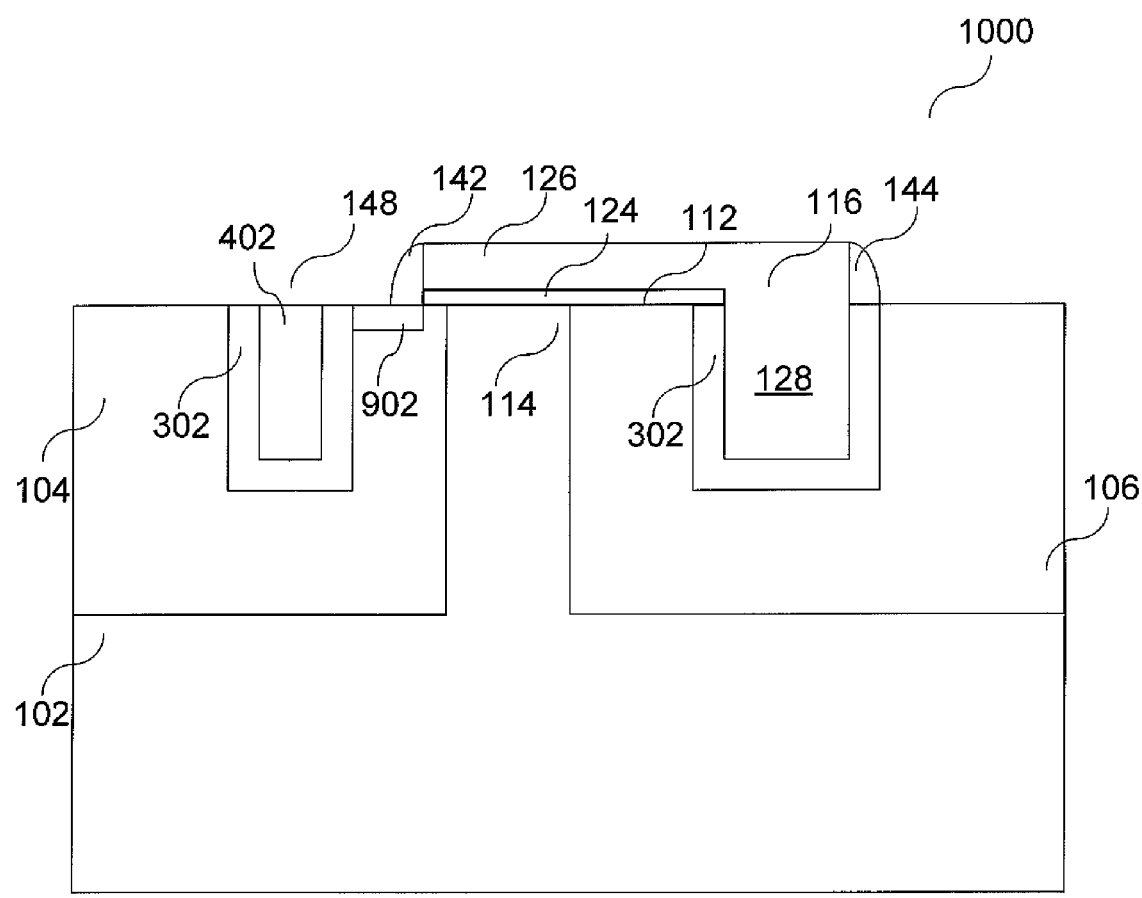
FIG. 10 shows a cross sectional view of a semiconductor device in accordance with an embodiment at an eighth stage of its manufacturing.

Moreover, the trench 116 may be filled with electrically conductive material 128. In other words, electrically conductive material 128 may be disposed over the first isolation layer 118 in the trench 116. In some embodiments, the electrically conductive material 128 may be the same material as the material of the gate region 126. In an alternative embodiment, the electrically conductive material 128 and the material of the gate region 126 may be different materials. In various embodiments, as will be described in more detail below, the electrically conductive material 128 and the material of the gate region 126 may be deposited in the same deposition process. As shown in FIG. 1, the electrically conductive material 128 and the material of the gate region 126 may be in direct physical contact and/or may be electrically coupled with each other. In general, in various embodiments, the electrically conductive material 128 is coupled to an electrical contact 130 (e.g. via the gate region 126 e.g. to a gate terminal 130 or to a separate individual electrical terminal or contact) configured to be coupled to an electrical potential, e.g. by means of a gate voltage source 132 coupled to the gate terminal 130. As shown in FIG. 10, in various embodiments, the material of the gate region 126 and the electrically conductive material 128 may be provided in one common layer, in other words, in one piece. Furthermore, in various embodiments, the material of the gate region 126 and the electrically conductive material 128 may be commonly produced in one common process or more common processes.

In various embodiments, the first source/drain region 108 and/or the second source/drain region 110 may include or consist of a silicide. Furthermore, the first source/drain region 108 may be connected to a first source/drain terminal (e.g. a source terminal) 134 and may be coupled to an electrical potential, e.g. by means of a first source/drain voltage source 136 coupled to the first source/drain terminal 134. The second source/drain region 110 may be connected to a second source/drain terminal (e.g. a drain terminal) 138 and may be coupled to an electrical potential, e.g. by means of a second source/drain voltage source 140 coupled to the second source/drain terminal 138.

As shown in FIG. 1, optionally, gate sidewall spacers 142, 144 (e.g. including or consisting of electrically isolating material such as e.g. an oxide (e.g. silicon oxide) or a nitride (e.g. silicon nitride)) may be provided at the sidewalls of and adjacent to the gate region 126. Furthermore, in various embodiments, the semiconductor device 100 may further include a lightly doped drain region 146 disposed between the first source/drain region 146 and the active region 114. The lightly doped drain region 146 may be disposed below the first gate sidewall spacer 142 and may be doped with n-doping atoms (such as e.g. Arsenic (As) or Phosphorous (P)) e.g. with a doping concentration in the range from about $10^{17}$ $cm^{-3}$ to about $10^{19}$ $cm^{-3}$, e.g. in the range from about $10^{17}$ $cm^{-3}$ to about $10^{18}$ $cm^{-3}$).

Furthermore, in various embodiments, the semiconductor device 100 may farther include a further trench 148 disposed next to the first source/drain region 108 opposite to the active region 114. The further trench 148 may have a similar depth or a different depth compared with the trench 116. The further trench 148 may be completely filled with an electrically insulating material such as a dielectric, e.g. an oxide (e.g. silicon oxide) or a nitride (e.g. silicon nitride). The further trench 148 may be a shallow trench isolation (STI).

In some embodiments, the electrically conductive material 128 in the trench 116 may act like an electrical isolation in the OFF-state of the semiconductor device 100 and may help in maintaining gate oxide reliability and hot carrier reliability. Furthermore, in some embodiments, it may reduce the on-resistance $R_{ON}$ in the ON-state of the semiconductor device 100 and may improve the mixed signal performance as compared e.g. to a standard STI DeMOS semiconductor device fabricated at same technology node.

Various embodiments may be based on a dual STI process and may provide one or more of the following effects:

Various embodiments may be useful for scaled technology nodes.

Various embodiments may provide improved gate oxide reliability and hot carrier reliability as compared to a LDDMOS semiconductor device and a DeMOS semiconductor device.

Various embodiments may provide improved mixed signal performance.

Various embodiments may provide improved variability.

Various embodiments may provide a high breakdown voltage.

Various embodiments may save two masks steps, e.g. the so-called LDD implantation mask and e.g. the so-called silicide blocking mask compared with the conventional LDDMOS process flow.

Various embodiments relate to a method to achieve improved turn-on behaviour and mixed signal performance of a Drain extended MOS device having high breakdown (higher than LDDMOS in the same technology node) with improved gate dielectric reliability and hot carrier reliability.

As shown in FIG. 1, a further doped region 150 (e.g. highly p-doped region) may be disposed next to the further trench 148 opposite to the first source/drain region 108.

Figure 2:
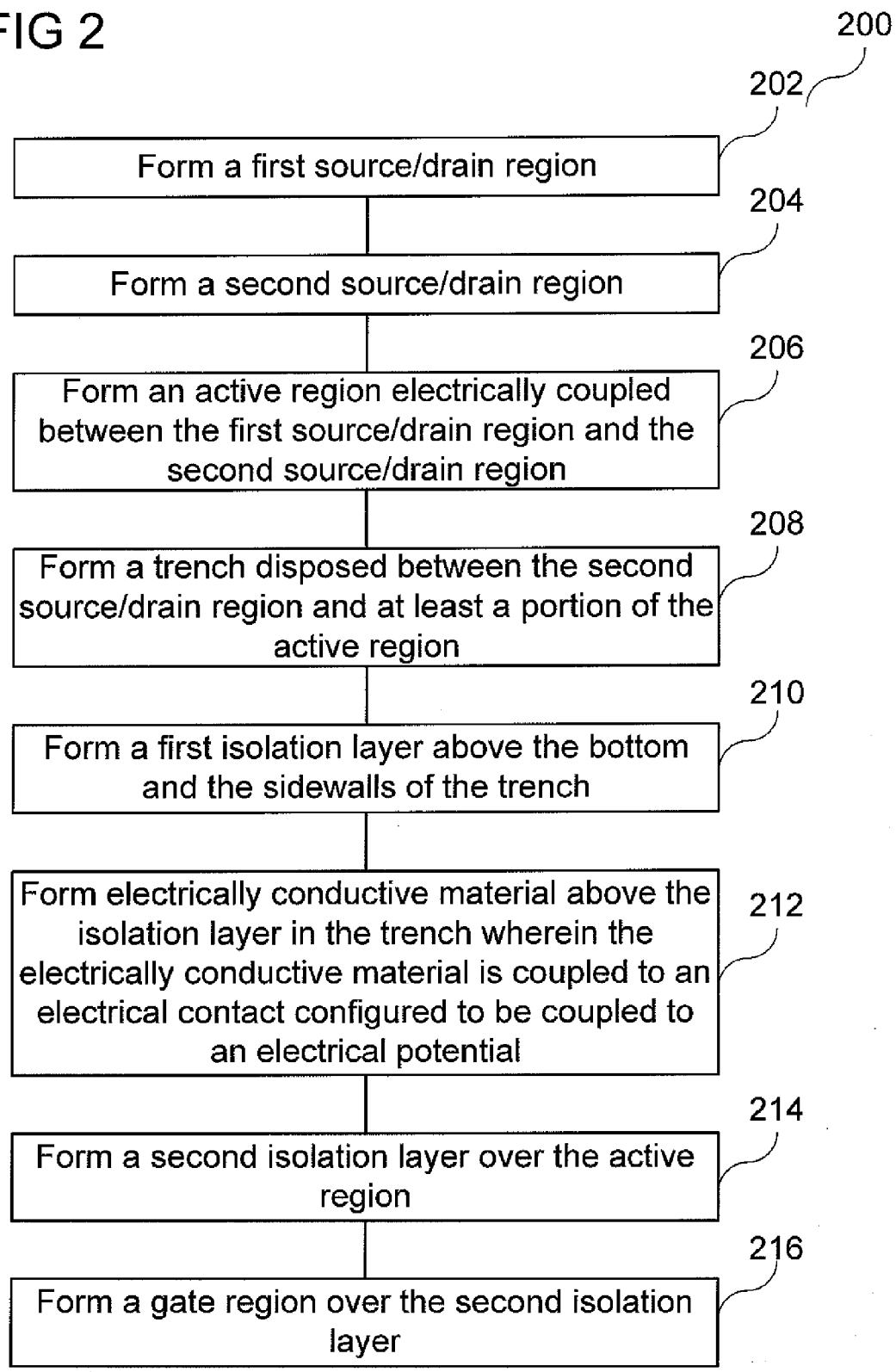
FIG. 2 shows a flow diagram illustrating a method for manufacturing a semiconductor device in accordance with an embodiment.

FIG. 2 shows a flow diagram 200 illustrating a method for manufacturing a semiconductor device in accordance with an embodiment. The method may include, in 202, forming a first source/drain region, and, in 204, forming a second source/drain region. The method may further include, in 206, forming an active region electrically coupled between the first source/drain region and the second source/drain region. The method may further include, in 208, forming a trench disposed between the second source/drain region and at least a portion of the active region. Furthermore, in 210, a first isolation layer may be formed above the bottom and the sidewalls of the trench, and, in 212, electrically conductive material may be formed over the isolation layer in the trench, wherein the electrically conductive material is coupled to an electrical contact configured to be coupled to an electrical potential. In 214, a second isolation layer may be formed over the active region, and, in 216, a gate region may be formed over the second isolation layer.

In an implementation of this embodiment, the method may further include forming a first well region, wherein the first source/drain region is formed within the first well region. In another implementation of this embodiment, the first source/drain region may be doped with doping atoms of a first conductivity type, and the first well region may be doped with doping atoms of a second conductivity type, wherein the second conductivity type is different from the first conductivity type. In yet another implementation of this embodiment, the method may further include forming a second well region, wherein the second source/drain region is formed within the second well region. In yet another implementation of this embodiment, the second source/drain region may be doped with doping atoms of a first conductivity type, and the second well region may be doped with doping atoms of the first conductivity type. In yet another implementation of this embodiment, the method may further include forming a lightly doped drain region between the first source/drain region and the active region. In yet another implementation of this embodiment, the first isolation layers may include or consist of at least one of the following materials consisting of: silicon oxide; silicon nitride high-k material. In yet another implementation of this embodiment, the second isolation layers may include or consist of at least one of the following materials: silicon oxide; silicon nitride high-k material. In yet another implementation of this embodiment, at least one of the first source/drain region and the second source/drain region may include or consist of silicide. In yet another implementation of this embodiment, the trench may be formed as a shallow trench isolation structure. In yet another implementation of this embodiment, the gate region may be electrically coupled with the electrically conductive material. In yet another implementation of this embodiment, the electrically conductive material may include or consist of a metal. In yet another implementation of this embodiment, the metal may include or consist of tungsten or a silicide (e.g. WSi). In yet another implementation of this embodiment, the method may further include forming a further trench disposed next to the first source/drain region opposite to the active region. In yet another implementation of this embodiment, the further trench may be formed as a shallow trench isolation structure.

The process illustrated below needs one additional masking step at the initial stage of the semiconductor device fabrication to plug-out the oxide from the trench, as will be described in more detail below.

Figure 3:
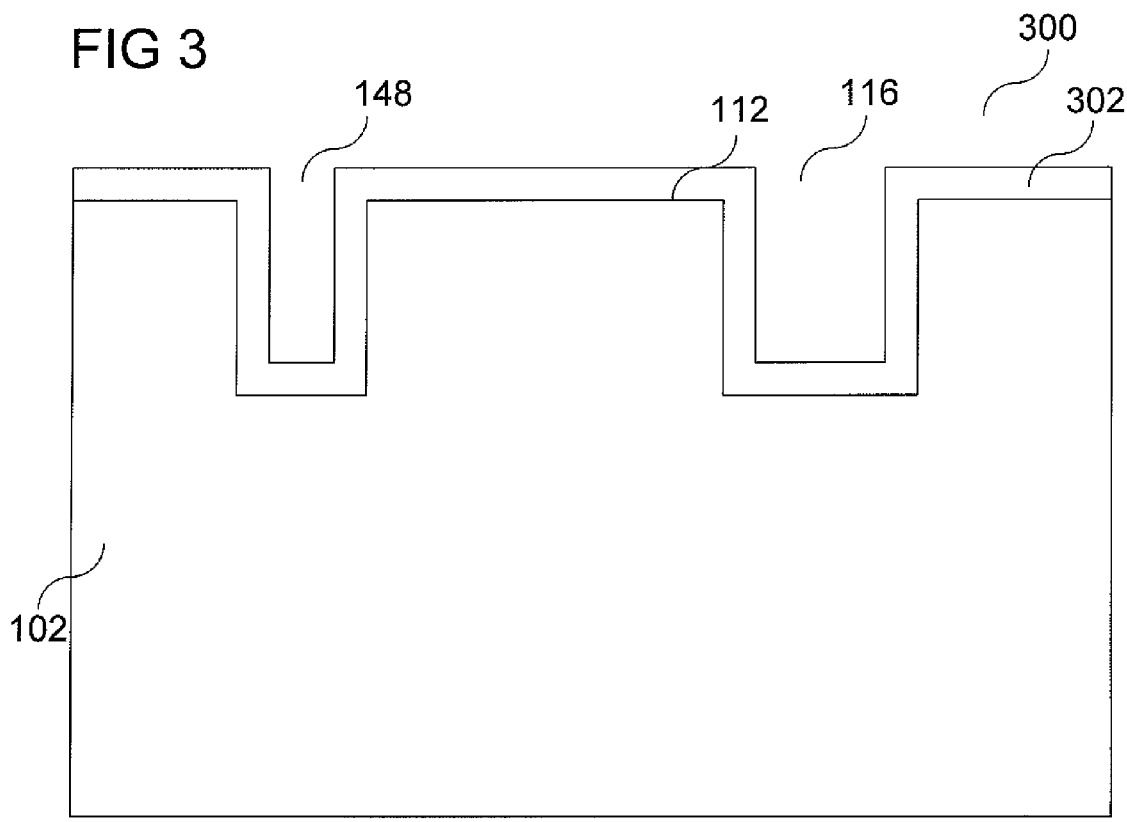
FIG. 3 shows a cross sectional view of a semiconductor device in accordance with an embodiment at a first stage of its manufacturing.

FIG. 3 shows a cross sectional view 300 of a semiconductor device in accordance with an embodiment at a first stage of its manufacturing. Although the elements described below with reference to the manufacturing process refer to an n-channel semiconductor device, the respective conductivity type of the doped regions may simply be inverted to provide a p-channel semiconductor device.

As shown in FIG. 3, a substrate 102, e.g. a p-doped substrate, e.g. a silicon substrate, e.g. a p-doped silicon substrate (e.g. having a doping concentration of p-doping atoms (such as e.g. Boron (B) atoms) in the range from about $10^{14}$ cm$^{-3}$ to about $10^{17}$ cm$^{-3}$, e.g. in the range from about $10^{15}$ cm$^{-3}$ to about $10^{16}$ cm$^{-3}$) in the case of an n-channel field effect semiconductor device 100, may be provided. In the case of a p-channel field effect semiconductor device 100, an n-doped well region (not shown) may be provided in which the p-channel field effect semiconductor device 100 might be located. The n-doped well region may be doped with n-doping atoms (such as e.g. Arsenic (As) or Phosphorous (P)) in the range from about $10^{15}$ cm$^{-3}$ to about $10^{19}$ cm$^{-3}$, e.g. in the range from about $10^{17}$ cm$^{-3}$ to about $10^{18}$ cm$^{-3}$). A first trench 116 and a second trench 148 may be formed into the substrate 102, e.g. by means of an etching process, e.g. by means of an anisotropic etching process such as e.g. a reactive ion etching (RIE) process. The first trench 116 and the second trench 148 may be laterally disposed from each other. In various embodiments, the first trench 116 may extend into the substrate 102 from the upper main processing surface 112 of the substrate 102 by a depth in the range from about 300 nm to about 400 nm. In various embodiments, the trench 116 may have a width in the range from about 200 nm to about 1000 nm. Thus, illustratively, in various embodiments, the trench 116 may be understood as a shallow trench isolation structure partially filled with electrically conductive material. The second trench 148 may have a similar depth or a different depth compared with the first trench 116. Furthermore, a liner layer 302, e.g. comprising of consisting of an electrically isolating material such as e.g. a nitride, e.g. silicon nitride, may be deposited over the entire exposed upper surface of the substrate 102, the bottom and the sidewall surfaces of the first trench 116 and the second trench 148. In an embodiment, the liner layer 302 may be formed to have a layer thickness in the range from about 4 nm to about 20 nm, e.g. to have a layer thickness in the range from about 5 nm to about 10 nm. It is to be noted that in some embodiments, the liner layer 302 in the first trench 116 may be an implementation of the first isolation layer.

Figure 4:
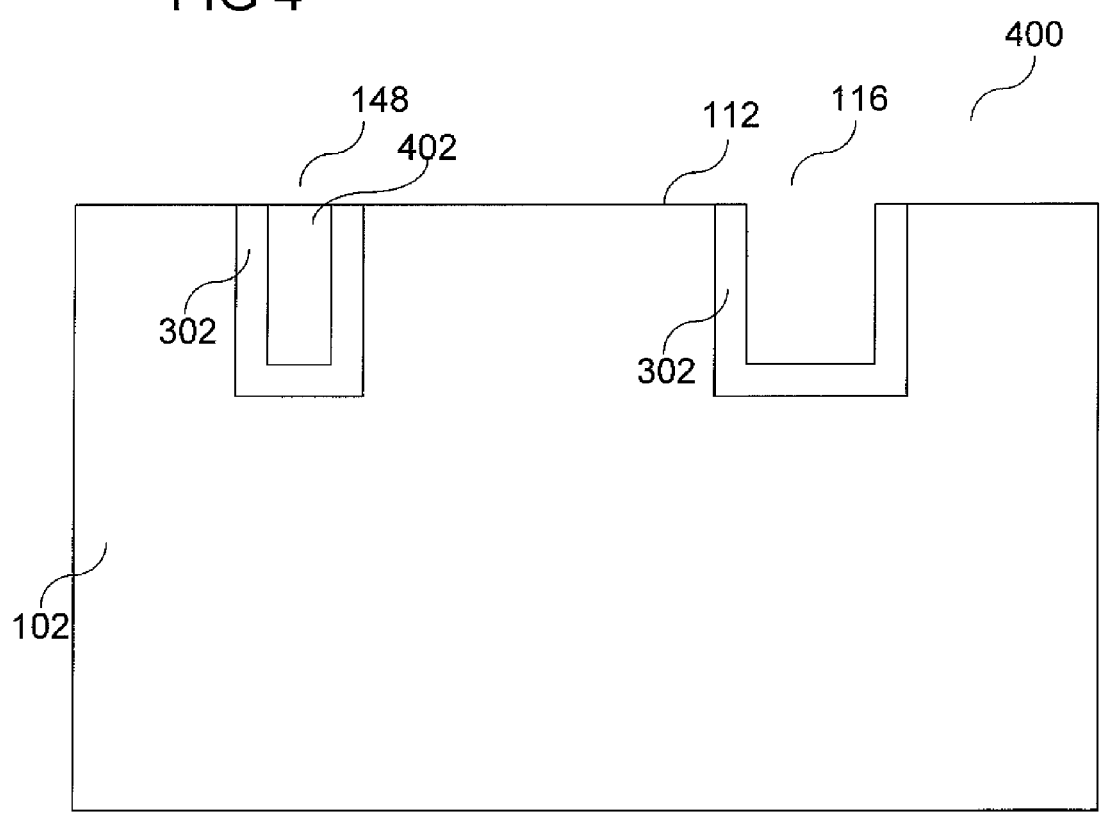
FIG. 4 shows a cross sectional view of a semiconductor device in accordance with an embodiment at a second stage of its manufacturing.

FIG. 4 shows a cross sectional view 400 of a semiconductor device in accordance with an embodiment at a second stage of its manufacturing.

Then, as shown in FIG. 4, portions of the liner layer 302 are removed from the upper main processing surface 112 of the substrate 102, whereas the portions of the liner layer covering the bottom and the sidewall surfaces of the first trench 116 and the second trench 148 remain. The removal of the portions of the liner layer 302 from the upper main processing surface 112 of the substrate 102 may be carried out by means of a polishing process, e.g. by means of a chemical mechanical polishing (CMP). Furthermore, the first trench 116 and the second trench 148 may be filled (and possibly overfilled) with an electrically isolating material 402 such as e.g. an oxide (e.g. silicon oxide). In an embodiment, the electrically isolating material 402 overfilling the trenches 116, 148 may be removed, e.g. using a CMP process. It is to be noted that the process flow may be different in an alternative embodiment, in which the removal of the liner layer 302 from the upper main processing surface 112 of the substrate 102 may be carried out after the deposition of the electrically isolating material 402. Furthermore, as shown in FIG. 4, in another process, the electrically isolating material 402 may be removed again (e.g. plugged out) from the first trench 116, so that only the second trench 148 remains filled with the electrically isolating material 402. In various embodiments, the removal of the electrically isolating material 402 from the first trench 116 may be carried out e.g. using an extra mask to e.g. etch the electrically isolating material 402 out of the first trench 116, which will later be used underneath the gate-to-drain overlap.

Figure 5:
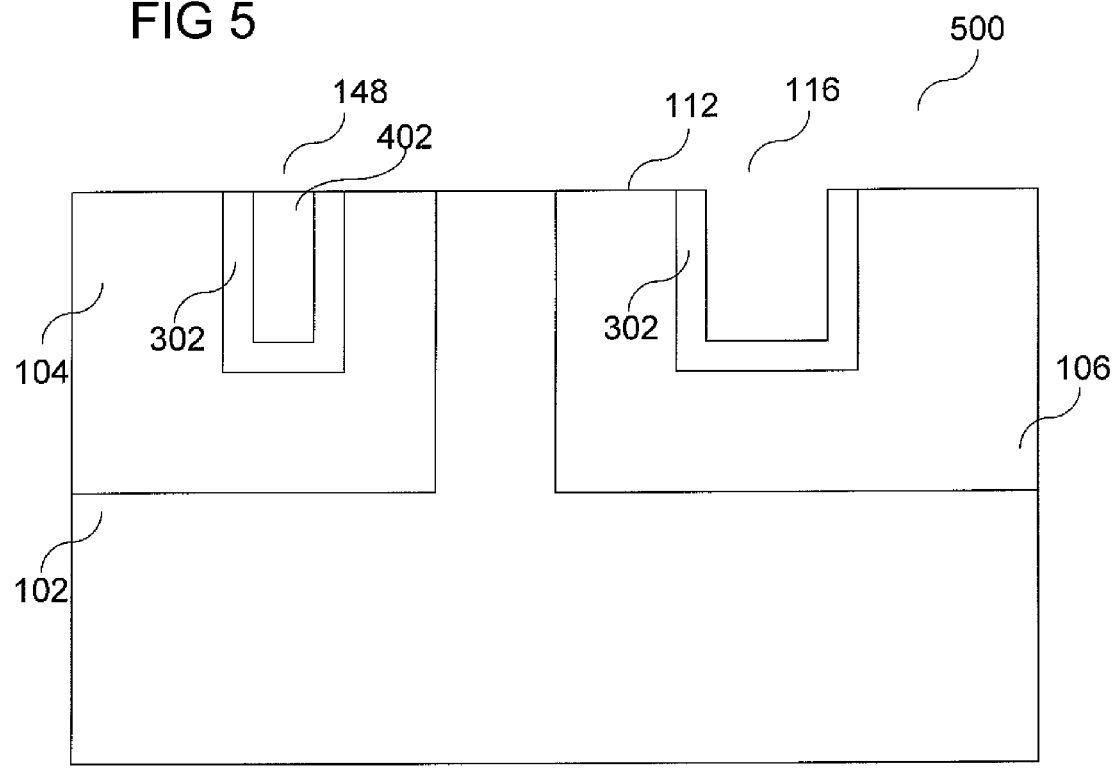
FIG. 5 shows a cross sectional view of a semiconductor device in accordance with an embodiment at a third stage of its manufacturing.

FIG. 5 shows a cross sectional view 500 of a semiconductor device in accordance with an embodiment at a third stage of its manufacturing.

Then, as shown in FIG. 5, well implant processes may be provided to form the first well region 104 and the second well region 106. It should be mentioned that the well formation processes may be carried out before the removal (e.g. etching) of the electrically isolating material 402 from the first trench 116.

By way of example, the first well region 104 may be formed, e.g. to be p-doped (e.g. having a well doping concentration of p-doping atoms (such as e.g. Boron (B) atoms) in the range from about $10^{16}$ cm$^{-3}$ to about $10^{19}$ cm$^{-3}$, e.g. in the range from about $5*10^{16}$ cm$^{-3}$ to about $5*10^{18}$ cm$^{-3}$, e.g. about $10^{17}$ cm$^3$. Furthermore, the second well region 106 may be formed, e.g. to be n-doped (e.g. having a well doping concentration of n-doping atoms (such as e.g. Arsenic (As) or Phosphorous (P)) in the range from about $10^{16}$ cm$^{-3}$ to about $10^{19}$ cm$^{-3}$, e.g. in the range from about $5*10^{16}$ cm$^{-3}$ to about $5*10^{18}$ cm$^{-3}$, e.g. about $10^{17}$ cm$^{-3}$. The second well region 106 may be formed to be laterally disposed from the first well region 104. In an alternative embodiment, the first well region 104 may be formed to laterally extend below the gate stack (which will be described in more detail below) to the second well region 106.

In various embodiments, the remaining process flow may be similar to the as such standard CMOS process flow and will be described in more detail below.

Figure 6:
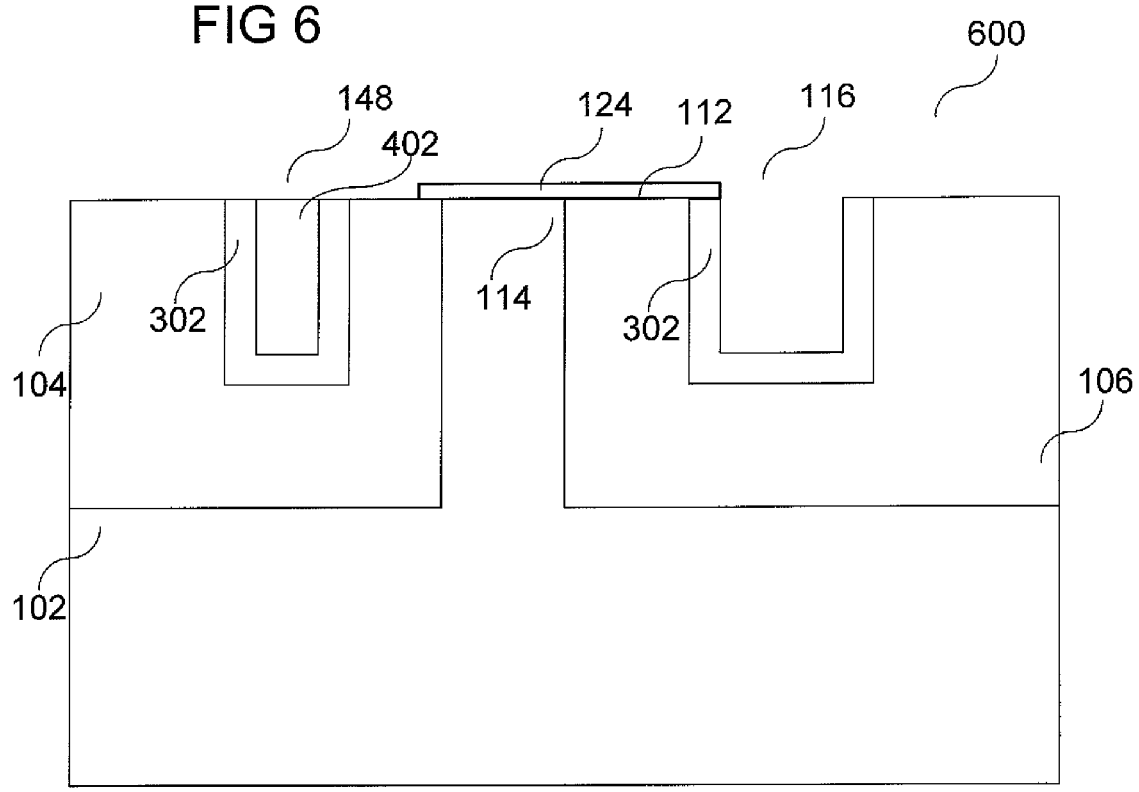
FIG. 6 shows a cross sectional view of a semiconductor device in accordance with an embodiment at a fourth stage of its manufacturing.

FIG. 6 shows a cross sectional view 600 of a semiconductor device in accordance with an embodiment at a fourth stage of its manufacturing.

In various embodiments, as shown in FIG. 6, the second isolation layer 124 (e.g. a gate dielectric layer 124) may be disposed (and suitably patterned) over an active region 114. The second isolation layer 124 may include or consist of a dielectric material such as e.g. an oxide (e.g. silicon oxide), a nitride (e.g. silicon nitride) or an oxynitride (ON). In alternative embodiments, the second isolation layer 124 may include or consist of high k dielectric material (i.e. e.g. a material having a dielectric constant of greater than the dielectric constant of silicon oxide (which has a dielectric constant of 3.9)). In various implementations, the second isolation layer 124 may include or consist of may include or consist of aluminum oxide ($Al_2O_3$), yttrium oxide ($Y_2O_3$), hafnium oxide ($HfO_2$), lanthanum oxide ($LaO_2$), zirconium oxide ($ZrO_2$), amorphous silicon (a-Si), tantalum oxide ($Ta_2O_5$), titanium oxide ($TiO_2$), and/or an aluminate. An example for an aluminate is an alloy of the components aluminum, zirconium and oxygen (AlZrO). In an implementation, the second isolation layer 124 may include or consist of a dielectric layer stack including three dielectric layers being formed above one another, e.g. a first oxide layer (e.g. silicon oxide), a nitride layer as charge trapping layer (e.g. silicon nitride) on the first oxide layer, and a second oxide layer (e.g. silicon oxide or aluminum oxide) on the nitride layer. This type of dielectric layer stack is also referred to as ONO layer stack. In an alternative implementation, the second isolation layer 124 may include or consist of two, four or even more dielectric layers being formed above one another. In some embodiments, the second isolation layer 124 may have a physical layer thickness in the range from about 1.5 nm to about 5 nm, e.g. a physical layer thickness in the range from about 2 nm to about 3 nm and/or an equivalent oxide thickness (EOT) in the range from about 1 nm to about 2 nm.

It is to be noted that in some embodiments, the liner layer 302 in the first trench 116 may be an implementation of the first isolation layer. Furthermore, in an option, the above described layer or layer structure that is deposited for the second isolation layer 124 may also be deposited on the bottom and the sidewalls of the first trench over the liner layer 302. In this case, the liner layer 302 together with the additional layer structure may be an implementation of the first isolation layer.

Figure 7:
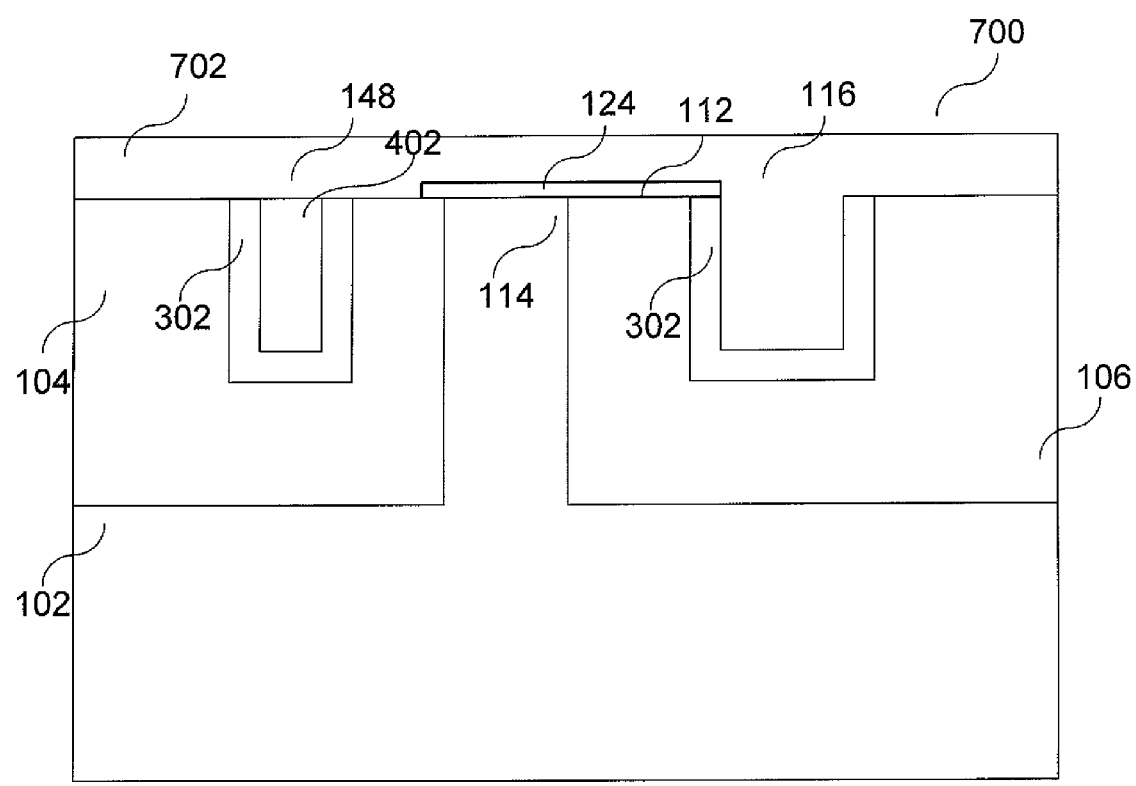
FIG. 7 shows a cross sectional view of a semiconductor device in accordance with an embodiment at a fifth stage of its manufacturing.

FIG. 7 shows a cross sectional view 700 of a semiconductor device in accordance with an embodiment at a fifth stage of its manufacturing.

Then, a layer 702 made of electrically conductive material (such as e.g. polysilicon (doped or undoped) or a metal, e.g. tungsten or a silicide (e.g. WSi)) is deposited over the entire upper surface of the semiconductor device resulting from the fourth stage of its manufacturing, wherein also the first trench 116 may be completely filled and possible overfilled.

Figure 8:
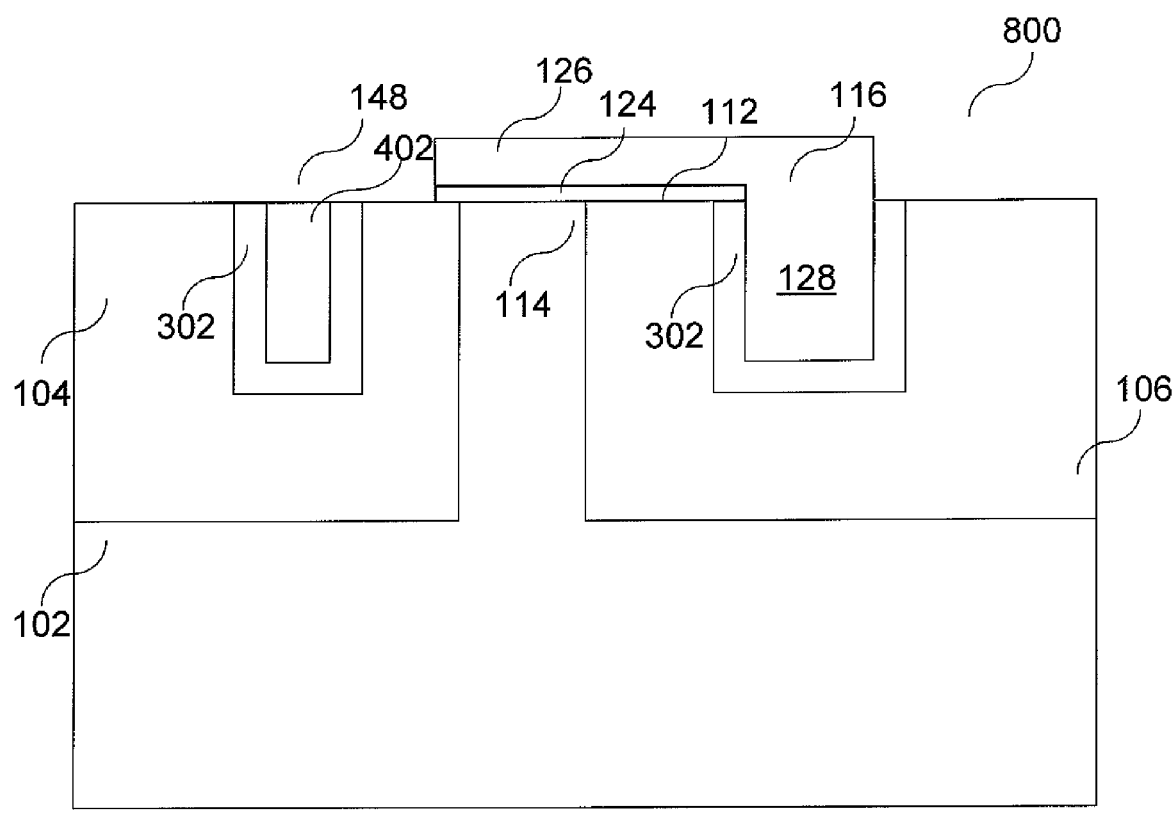
FIG. 8 shows a cross sectional view of a semiconductor device in accordance with an embodiment at a sixth stage of its manufacturing.

FIG. 8 shows a cross sectional view 800 of a semiconductor device in accordance with an embodiment at a sixth stage of its manufacturing.

Then, the layer 702 may be patterned to form the electrically conductive material 126 of the gate region to be formed as well as the electrically conductive material 128 filling the first trench 116. In some embodiments, the electrically conductive material 126 of the gate region to be formed and the electrically conductive material 128 filling the first trench 116 may be physically and electrically coupled with each other. Furthermore, it should be mentioned that the patterning of the layer 702 should be carried out in such a way that the electrically conductive material of the patterned layer 702 does not touch (in other words is not in direct physical or electrical contact) with the upper surface of the semiconductor material of the substrate 102, e.g. the silicon, in particular not with the upper surface of the semiconductor material of the substrate 102, in which the source/drain regions 108, 110 (e.g. the source region 108 or the drain region 110) will later be formed.

Figure 9:
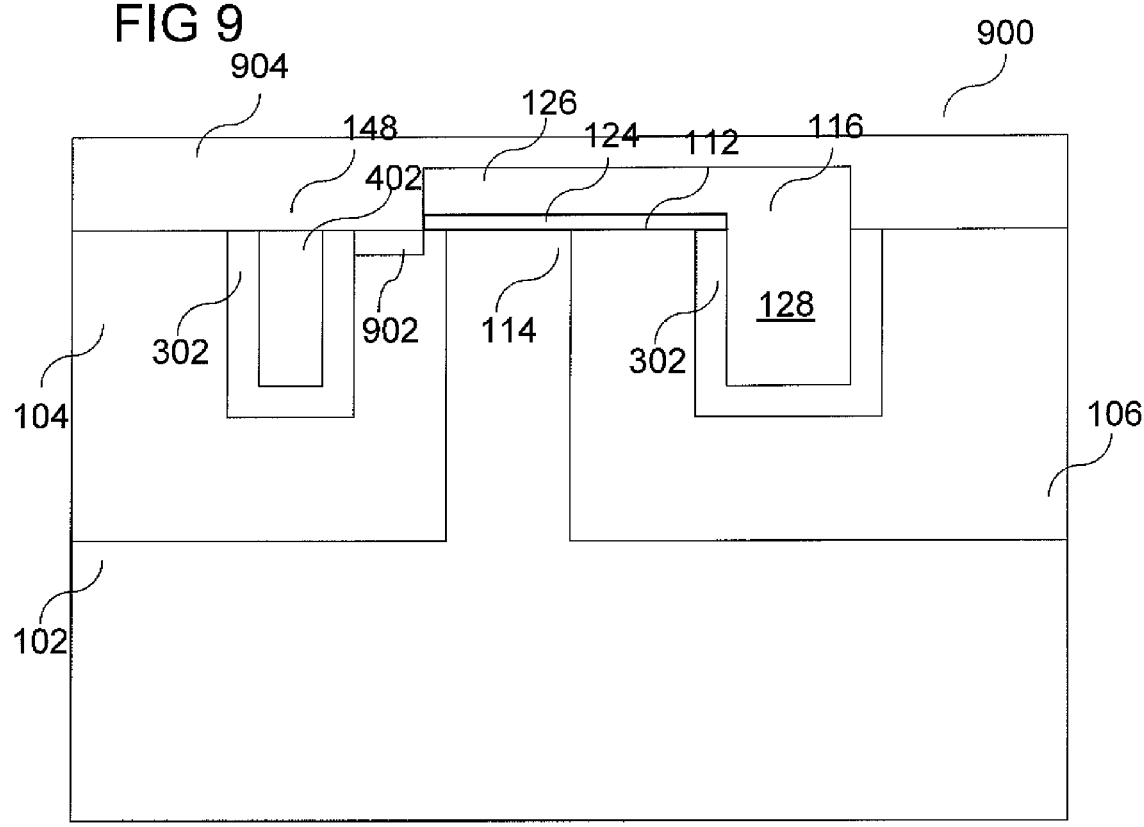
FIG. 9 shows a cross sectional view of a semiconductor device in accordance with an embodiment at a seventh stage of its manufacturing.

FIG. 9 shows a cross sectional view 900 of a semiconductor device in accordance with an embodiment at a seventh stage of its manufacturing.

Next, as shown in FIG. 9, a lightly doped drain (LDD) ion implantation process may be carried out to form a lightly doped drain (LDD) implant region 902 which may include the lightly doped drain region 146. Furthermore, electrically insulating material 904 (e.g. an oxide such as e.g. silicon oxide) may be deposited over the entire upper surface of the semiconductor device resulting from the sixth stage of its manufacturing, wherein the electrically insulating material 904 may be used to form the sidewall spacers 142, 144, as will be described in more detail below.

FIG. 10 shows a cross sectional view 1000 of a semiconductor device in accordance with an embodiment at an eighth stage of its manufacturing.

Then, the sidewall spacers 142, 144 may be formed, e.g. by means of a spacer etch process, thereby exposing a portion of the upper surface of the lightly doped drain (LDD) implant region 902, in which portion the first source/drain region 108 may be formed at a subsequent process, and a portion of the upper surface of the substrate 102, in which portion the second first source/drain region 110 may be formed at a subsequent process.

Figure 11:
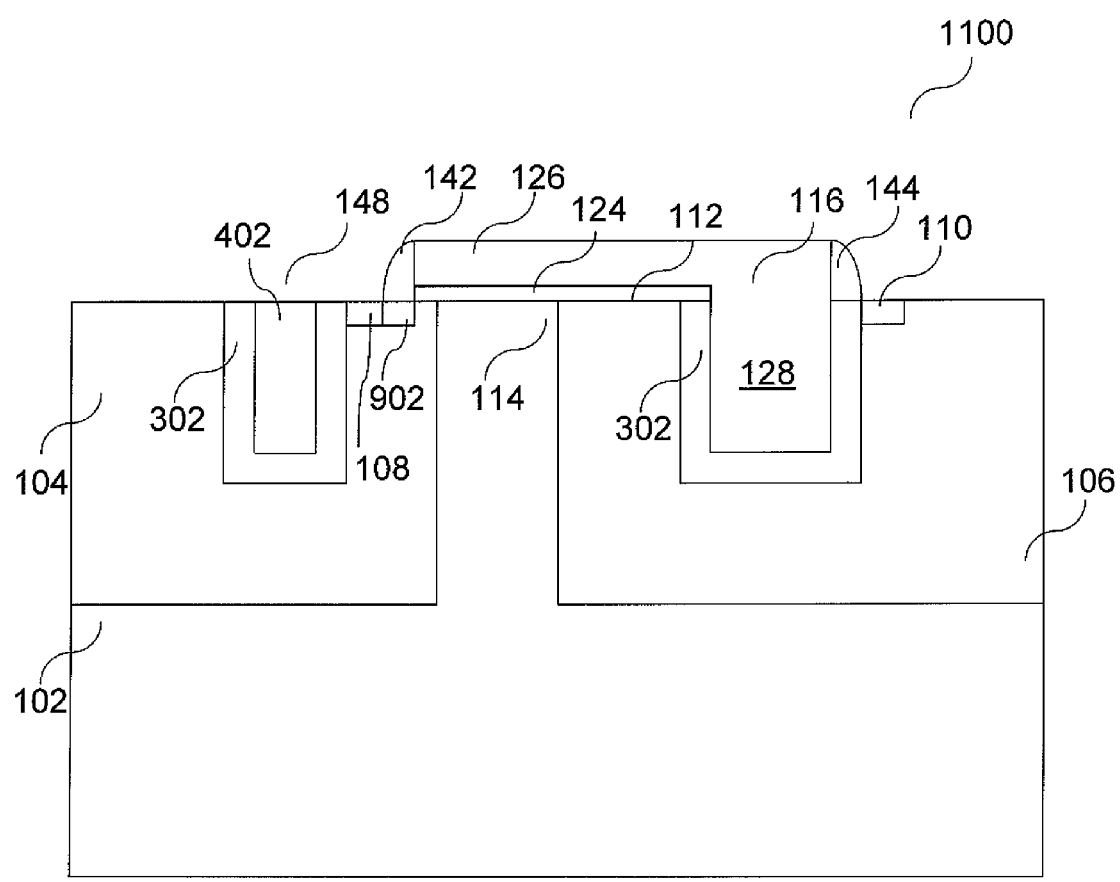
FIG. 11 shows a cross sectional view of a semiconductor device in accordance with an embodiment at a ninth stage of its manufacturing.

FIG. 11 shows a cross sectional view 1100 of a semiconductor device in accordance with an embodiment at a ninth stage of its manufacturing.

Then, another ion implantation process is carried out to form the first source/drain region 108 (e.g. the source region 108) and the second source/drain region 110 (e.g. the drain region 110). The ion implantation process may be carried out in such a manner that the first source/drain region 108 and the second source/drain region 110 may be highly n-doped ($n^+$ doped) having a doping concentration in the range from about $10^{19}$ cm$^{-3}$ to about $10^{21}$ cm$^{-3}$, e.g. with a doping concentration of doping atoms in the range from about $5*10^{19}$ cm$^{-3}$ to about $5*10^{20}$ cm$^{-3}$. In general, the first source/drain region 108 and the second source/drain region 110 may be doped with doping atoms of a first conductivity type, and the first well region 104 may be doped with doping atoms of a second conductivity type, wherein the second conductivity type is different from the first conductivity type.

In various embodiments, the first source/drain region 108 as well as the second source/drain region 110 may be formed such that they extend into the substrate 102 from the upper main processing surface 112 of the substrate 102 by a depth in the range from about 50 nm to about 200 nm, wherein the depth of the first source/drain region 108 and the depth of the second source/drain region 110 may be similar or different from each other. Furthermore, the external contacts may be formed (e.g. for the first source/drain region, the second source/drain region or the gate region) including e.g. a silicidation process.

In various embodiments, the width of the first trench 116 and the thickness of the gate region may be parameters having influence of the characteristics of the semiconductor device 100, e.g. having influence on the filling of the first trench 116 underneath the gate-to-drain overlap. In various embodiments, the first trench 116 has a depth in the range from about 300 nm to about 400 nm and a width in the range from about 200 nm to about 1000 nm.

Figure 12:
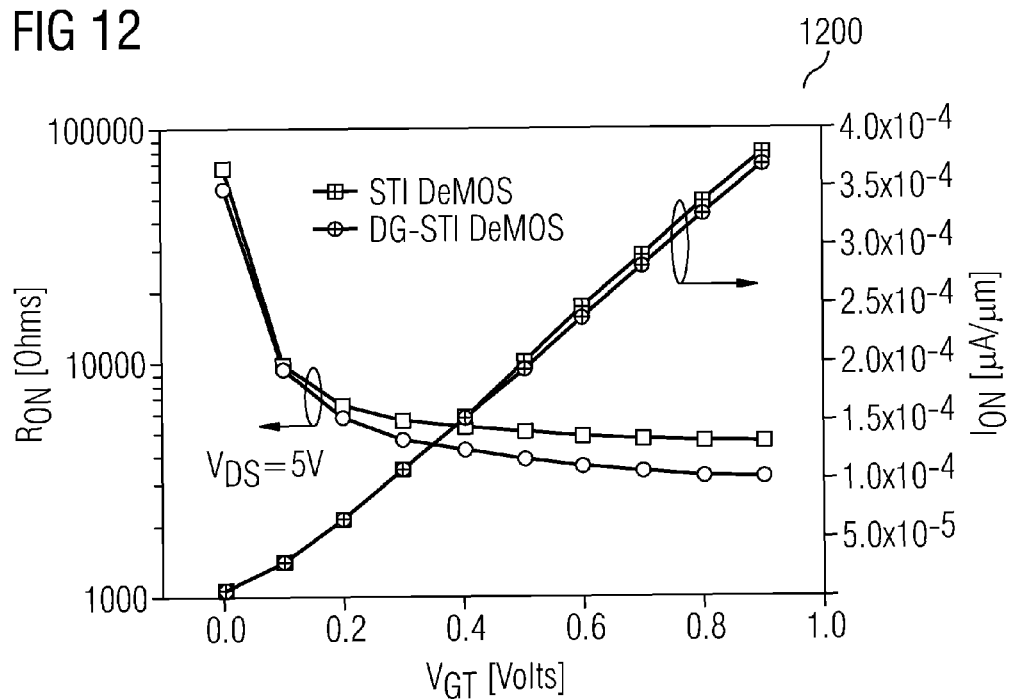
FIG. 12 shows a diagram illustrating the On-resistance and the On-current dependent from the applied gate voltage of the semiconductor device of FIG. 1.

FIG. 12 shows a diagram 1200 illustrating the On-resistance ($R_{ON}$) and the On-current ($I_{ON}$) dependent from the applied gate voltage ($V_{GT}$). As is shown in FIG. 12, the semiconductor device 100 having illustratively the dual gate STI DeMOS structure (in other words, the first trench being at least partially filled with electrically conductive material and coupled to an external contact terminal) shows a 30% lower On-resistance ($R_{ON}$) compared with the conventional STI DeMOS device for the same dimensions.

Figure 13:
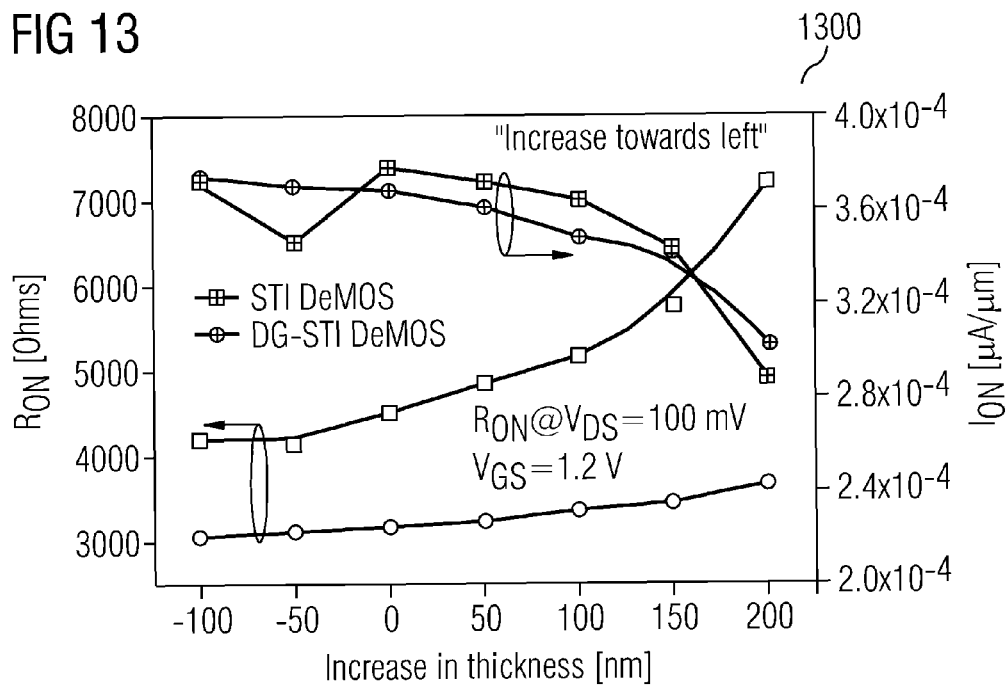
FIG. 13 shows a diagram illustrating the On-resistance and the On-current dependent from the thickness of the insulating layer within the first trench of the semiconductor device of FIG. 1.

FIG. 13 shows a diagram 1300 illustrating the On-resistance and the On-current dependent from the thickness of the insulating layer within the first trench of the semiconductor device 100 of FIG. 1. As shown in FIG. 13, semiconductor device 100 having illustratively the dual gate STI DeMOS structure (in other words, the first trench being at least partially filled with electrically conductive material and coupled to an external contact terminal) shows higher variability in the On-resistance ($R_{ON}$) compared with the conventional STI DeMOS device for the same dimensions.

Figure 14:
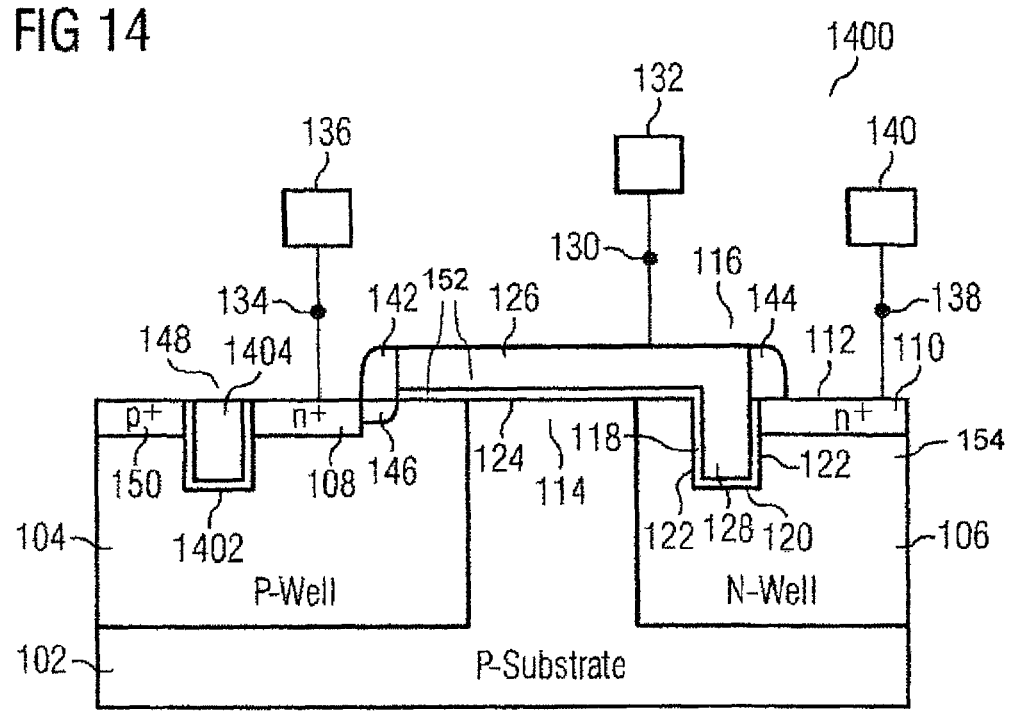
FIG. 14 shows a cross sectional view of a semiconductor device in accordance with another embodiment.

FIG. 14 shows a cross sectional view of a semiconductor device 1400 in accordance with another embodiment. The semiconductor device 1400 of FIG. 14 is similar to the semiconductor device 100 of FIG. 1 with the main difference that in the semiconductor device 1400 of FIG. 14, the second trench 148 is not completely filled with electrically insulating material such as an oxide (e.g. silicon oxide), but has another structure, which is similar to the structure of the first trench 116. Illustratively, the second trench 148 in the semiconductor device 1400 of FIG. 14 is not a shallow trench isolation, but has an electrically insulating layer 1402 (which may be similar to the first isolation layer 118) covering the bottom and the sidewalls of the second trench 148, but may also be filled with electrically conductive material 1404. Thus, the completed structure of the second trench 148 may be similar to the completed structure of the first trench 116 in accordance with this embodiment. Illustratively, in various embodiments, the second trench 148 may be filled with Metal or Pre-doped polysilicon (after the formation of a nitride liner, for example).

Figure 15:
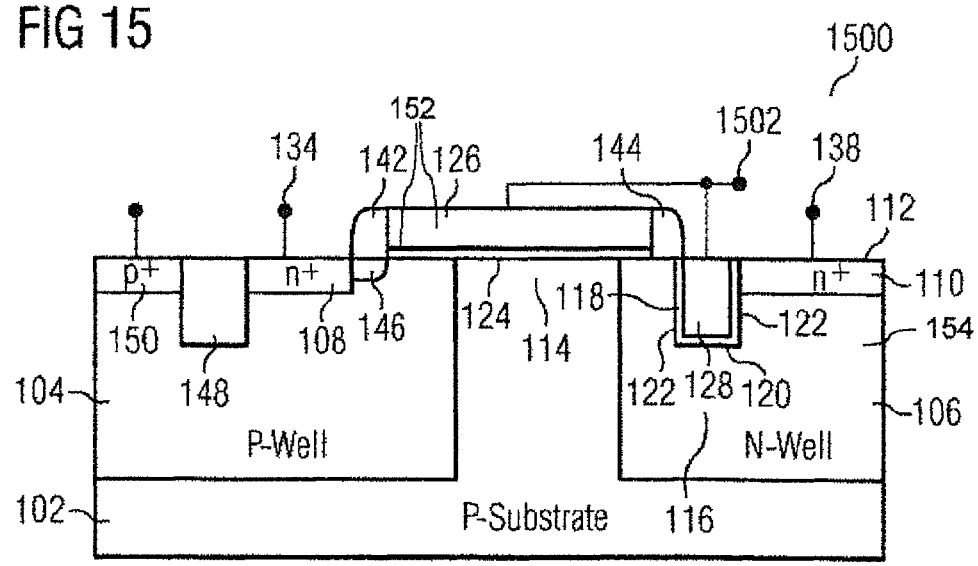
FIG. 15 shows a cross sectional view of a semiconductor device in accordance with yet another embodiment.

FIG. 15 shows a cross sectional view of a semiconductor device 1500 in accordance with yet another embodiment. The semiconductor device 1500 of FIG. 15 is similar to the semiconductor device 100 of FIG. 1 with the main difference that in the semiconductor device 1500 of FIG. 15, the electrically conductive material of the gate region 126 is not directly physically coupled with the electrically conductive material 128 filling the first trench 116, but they are physically (and electrically) isolated from each other by means of the second isolation layer 124, the sidewall spacer 144 and the first isolation layer 118. However, in various embodiments, the electrically conductive material 128 filling the first trench 116 may be coupled to an external contact terminal 1502 which in turn may be coupled to the gate region 126 for the application of an external voltage. Illustratively, the electrically conductive material 128 filling the first trench 116 and the gate region 126 may both be coupled to the external contact terminal 1502, but in alternative embodiments, they may also be coupled to two separated external contact terminal for the application of external voltages. Thus, a structure having two separate gates that can be externally connected to each other or separately to two power (e.g. voltage) sources may be provided in various embodiments. One gate may be used to invert the channel region and the other gate may be used to improve the gate oxide breakdown in off-state of the semiconductor device and improve turn-on characteristics in on-state of the semiconductor device. The two gates may thus also be controlled separately and independently from each other.

In another embodiment, the above described features of the semiconductor device 1400 of FIG. 14 and of the semiconductor device 1500 of FIG. 15 may be combined (not shown in the figures).

In various embodiments, a semiconductor device may be processed in a dual gate process, where the one trench may be used as an isolation between devices (e.g. implemented as an STI) and the other trench in the N-Well underneath the drain edge of the gate region of a so-called drain extended high voltage device, may be used to form a U-shaped gate. The second gate may be constructed from an isolating layer and a conductive gate material both filling the trench. By applying a gate voltage, the drain region may be modified from accumulation to depletion changing the drain resistance of the semiconductor device.

In various embodiments, the existing conventional trench etching process and gate deposition process may be used. In some embodiments, the second gate formed underneath the gate-to-drain overlap region may protect against gate oxide breakdown and may improve hot carrier reliability in the off state. It may give an improved turn-on behaviour of the semiconductor device in accordance with various embodiments as compared to a conventional DeMOS processed semiconductor device in STI technology and may enhance the mixed signal performance.

In various embodiments, methods of forming a variation of a dual gate high voltage input/output (I/O) semiconductor device in sub 65 nm technology are provided.

In various embodiments, a novel way to improve mixed signal performance of a drain extended MOS (having an STI underneath gate-drain overlap) semiconductor device may be provided without degrading gate oxide reliability and hot carrier reliability.

In various embodiments, a semiconductor device is provided, which may include a first source/drain region, a second source/drain region, an active region electrically coupled between the first source/drain region and the second source/drain region, a drain extended structure 154 disposed next to the second source/drain region, a trench disposed between the first source/drain region and the second source/drain region a first isolation layer disposed over the bottom and the sidewalls of the trench, electrically conductive material disposed over the isolation layer in the trench, and a gate structure 152 disposed over the second isolation layer. The electrically conductive material may be coupled to an electrical contact configured to be coupled to a power source. In an implementation of these embodiments, the gate structure may include a gate isolation layer disposed over the active region, and a gate region disposed over the gate isolation layer. In another implementation of these embodiments, the power source is a voltage source. In yet another implementation of these embodiments, the semiconductor device may further include a first well region, wherein the first source/drain region may be disposed within the first well region. In yet another implementation of these embodiments, the first source/drain region may be doped with doping atoms of a first conductivity type, and the first well region may be doped with doping atoms of a second conductivity type, wherein the second conductivity type is different from the first conductivity type. In yet another implementation of these embodiments, the drain extended structure 154 may include a second well region 106, wherein the second source/drain region may be disposed within the second well region. In yet another implementation of these embodiments, the second source/drain region may be doped with doping atoms of a first conductivity type, and the second well region may be doped with doping atoms of the first conductivity type. In yet another implementation of these embodiments, the semiconductor device may further include a lightly doped drain region disposed between the first source/drain region and the active region. In yet another implementation of these embodiments, the first isolation layer may include a material selected from a group of materials consisting of: silicon oxide; silicon nitride high-k material. In yet another implementation of these embodiments, the second isolation layer may include a material selected from a group of materials consisting of: silicon oxide; silicon nitride high-k material. In yet another implementation of these embodiments, the at least one of the first source/drain region and the second source/drain region may include silicide. In yet another implementation of these embodiments, the trench may be configured as a shallow trench isolation structure. In yet another implementation of these embodiments, the gate region may be electrically coupled with the electrically conductive material. In yet another implementation of these embodiments, the electrically conductive material may include a metal. In yet another implementation of these embodiments, the metal may be selected from a group of metals consisting of: tungsten, aluminum, copper or any silicide like NiSi, TiSi, CoSi. In yet another implementation of these embodiments, the semiconductor device may further include a further trench disposed next to the first source/drain region opposite to the active region. In yet another implementation of these embodiments, the further trench may be configured as a shallow trench isolation structure.

In various embodiments, a method for manufacturing a semiconductor device is provided. The method may include forming a first source/drain region, forming a second source/drain region, forming an active region between the first source/drain region and the second source/drain region, forming a drain extended structure next to the second source/drain region, forming a trench between the first source/drain region and the second source/drain region, forming a first isolation layer above the bottom and the sidewalls of the trench, forming electrically conductive material above the isolation layer in the trench, forming a gate structure above the second isolation layer, wherein the electrically conductive material is coupled to an electrical contact configured to be coupled to a power source. In an implementation of these embodiments, the forming of the gate structure may include forming a gate isolation layer above the active region, and forming a gate region above the gate isolation layer. In yet another implementation of these embodiments, the power source may be a voltage source. In yet another implementation of these embodiments, the method may further include forming a first well region, wherein the first source/drain region is formed within the first well region. In yet another implementation of these embodiments, the first source/drain region may be doped with doping atoms of a first conductivity type, and the first well region may be doped with doping atoms of a second conductivity type, wherein the second conductivity type is different from the first conductivity type. In yet another implementation of these embodiments, the drain extended structure may include a second well region, wherein the second source/drain region may be disposed within the second well region. In yet another implementation of these embodiments, the second source/drain region may be doped with doping atoms of a first conductivity type, and the second well region may be doped with doping atoms of the first conductivity type. In yet another implementation of these embodiments, the method may further include forming a lightly doped drain region between the first source/drain region and the active region. In yet another implementation of these embodiments, the first isolation layer may include a material selected from a group of materials consisting of: silicon oxide; silicon nitride high-k material. In yet another implementation of these embodiments, the second isolation layer may include a material selected from a group of materials consisting of: silicon oxide; silicon nitride high-k material. In yet another implementation of these embodiments, at least one of the first source/drain region and the second source/drain region may include silicide. In yet another implementation of these embodiments, the trench may be formed as a shallow trench isolation structure. In yet another implementation of these embodiments, the gate region may be electrically coupled with the electrically conductive material. In yet another implementation of these embodiments, the electrically conductive material may include a metal. In yet another implementation of these embodiments, the metal may be selected from a group of metals consisting of: tungsten, aluminum, copper or any silicide like NiSi, TiSi, CoSi. In yet another implementation of these embodiments, the method may further include forming a further trench next to the first source/drain region opposite to the active region. In yet another implementation of these embodiments, the further trench may be configured as a shallow trench isolation structure.

In various embodiments, a semiconductor device is provided. The semiconductor device may include a first source/drain region, a second source/drain region, an active region electrically coupled between the first source/drain region and the second source/drain region, a drain extended structure disposed next to the second source/drain region, a shallow trench isolation structure disposed between the first source/drain region and the second source/drain region, wherein the shallow trench isolation structure is partially filled with electrically conductive material, and a gate structure disposed over the active region. The electrically conductive material may be coupled to an electrical contact configured to be coupled to a power source. The coupling path can include a control circuit. In an implementation of these embodiments, the gate structure may include a gate isolation layer disposed over the active region, and a gate region disposed over the gate isolation layer. In yet another implementation of these embodiments, the power source is a voltage source. In yet another implementation of these embodiments, the semiconductor device may further include a first well region, wherein the first source/drain region may be disposed within the first well region. In yet another implementation of these embodiments, the first source/drain region may be doped with doping atoms of a first conductivity type, and the first well region may be doped with doping atoms of a second conductivity type, wherein the second conductivity type is different from the first conductivity type. In yet another implementation of these embodiments, the drain extended structure may include a second well region, wherein the second source/drain region may be disposed within the second well region. In yet another implementation of these embodiments, the second source/drain region may be doped with doping atoms of a first conductivity type, and the second well region may be doped with doping atoms of the first conductivity type. In yet another implementation of these embodiments, the semiconductor device may further include a lightly doped drain region disposed between the first source/drain region and the active region. In yet another implementation of these embodiments, the first isolation layer may include a material selected from a group of materials consisting of: silicon oxide; silicon nitride high-k material. In yet another implementation of these embodiments, the second isolation layer may include a material selected from a group of materials consisting of: silicon oxide; silicon nitride high-k material. In yet another implementation of these embodiments, at least one of the first source/drain region and the second source/drain region may include silicide. In yet another implementation of these embodiments, the gate region may be electrically coupled with the electrically conductive material. In yet another implementation of these embodiments, the electrically conductive material may include a metal. In yet another implementation of these embodiments, the metal may be selected from a group of metals consisting of: tungsten, aluminum, copper or any silicide like NiSi, TiSi, CoSi. In yet another implementation of these embodiments, the semiconductor device may further include a further trench disposed next to the first source/drain region opposite to the active region. In yet another implementation of these embodiments, the further trench may be configured as a shallow trench isolation structure.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A semiconductor device, comprising:
a substrate including a first well region, and a second well region spaced apart from the first well region by an active region;
a first source/drain region disposed within the first well region;
a second source/drain region disposed within the second well region;
the active region electrically coupled between the first source/drain region and the second source/drain region;
wherein the active region comprises a region of lower doping concentration disposed between the first well region and the second well region, wherein the region of lower doping concentration has a concentration lower than a doping concentration of each of the first well region and the second well region;
a trench disposed between the second source/drain region and at least a portion of the active region;
a first isolation layer disposed over a bottom and sidewalls of the trench;
electrically conductive material disposed in the trench, wherein the electrically conductive material is disposed over the first isolation layer;
a second isolation layer disposed over the active region; and
a gate region disposed over the second isolation layer;
wherein the electrically conductive material is coupled to an electrical contact.

2. The semiconductor device of claim 1,
wherein the first source/drain region is doped with doping atoms of a first conductivity type; and
wherein the first well region is doped with doping atoms of a second conductivity type, wherein the second conductivity type is different from the first conductivity type.

3. The semiconductor device of claim 1,
wherein the second source/drain region is doped with doping atoms of a first conductivity type; and
wherein the second well region is doped with doping atoms of the first conductivity type.

4. The semiconductor device of claim 1, further comprising:
a lightly doped drain region disposed between the first source/drain region and the active region.

5. The semiconductor device of claim 1,
wherein the trench is configured as a shallow trench isolation structure.

6. The semiconductor device of claim 1,
wherein the gate region is electrically coupled with the electrically conductive material.

7. The semiconductor device of claim 1,
wherein the electrically conductive material comprises a metal.

8. The semiconductor device of claim 1, further comprising:
a further trench disposed next to the first source/drain region opposite to the active region.

9. The semiconductor device of claim 8,
wherein the further trench is configured as a shallow trench isolation structure.

10. A semiconductor device, comprising:
a substrate including a first well region, and a second well region spaced apart from the first well region by an active region;
a first source/drain region disposed within the first well region;
a second source/drain region disposed within the second well region;
the active region electrically coupled between the first source/drain region and the second source/drain region;
wherein the active region comprises a region of lower doping concentration disposed between the first well region and the second well region, wherein the region of lower doping concentration has a lower doping concentration than that of each of the first well region and the second well region;
a drain extended structure disposed next to the second source/drain region;
a trench disposed between the first source/drain region and the second source/drain region;
a first isolation layer disposed over a bottom and sidewalls of the trench;
electrically conductive material disposed in the trench, wherein the electrically conductive material is disposed over the first isolation layer;
a second isolation layer disposed over the active region; and
a gate structure disposed over the second isolation layer;
wherein the electrically conductive material is coupled to an electrical contact.

11. The semiconductor device of claim 10,
wherein the gate structure comprises:
a gate isolation layer disposed over the active region; and
a gate region disposed over the gate isolation layer.

12. The semiconductor device of claim 10,
wherein the electrical contact is coupled to a power source, wherein the power source is a voltage source.

13. A semiconductor device, comprising:
a substrate including a first well region, and a second well region spaced apart from the first well region by an active region;
a first source/drain region disposed within the first well region;
a second source/drain region disposed within the second well region;
the active region electrically coupled between the first source/drain region and the second source/drain region;
wherein the active region comprises a region of lower doping concentration disposed between the first well region and the second well region, wherein the region of lower doping concentration has a lower doping concentration than that of each of the first well region and the second well region;
a drain extended structure disposed next to the second source/drain region;
a shallow trench isolation structure disposed between the first source/drain region and the second source/drain region, wherein the shallow trench isolation structure is partially filled with electrically conductive material; and
a gate structure disposed over the active region;
wherein the electrically conductive material is coupled to an electrical contact.

14. The semiconductor device of claim 13,
wherein the gate structure comprises:
a gate isolation layer disposed over the active region; and
a gate region disposed over the gate isolation layer.

15. The semiconductor device of claim 13,
wherein the electrical contact is coupled to a power source, wherein the power source is a voltage source.

16. The semiconductor device of claim 13, further comprising:
a further trench disposed next to the first source/drain region opposite to the active region.

* * * * *